US012563691B2

(12) United States Patent
Lu

(10) Patent No.: US 12,563,691 B2
(45) Date of Patent: Feb. 24, 2026

(54) TRAY AND SERVER DEVICE

(71) Applicant: ASRock Rack Inc., Taipei (TW)

(72) Inventor: Bo-Sian Lu, Taipei (TW)

(73) Assignee: ASROCK RACK INC., Taipei (TW)

( * ) Notice: Subject to any disclaimer, the term of this patent is extended or adjusted under 35 U.S.C. 154(b) by 145 days.

(21) Appl. No.: 18/423,523

(22) Filed: Jan. 26, 2024

(65) Prior Publication Data

US 2024/0349438 A1      Oct. 17, 2024

(30) Foreign Application Priority Data

Apr. 12, 2023    (TW) ................................. 112203357

(51) Int. Cl.
H05K 7/14 (2006.01)
(52) U.S. Cl.
CPC ................................. H05K 7/1487 (2013.01)
(58) Field of Classification Search
CPC ......... H05K 7/14; H05K 7/1417–1418; H05K 7/142; H05K 7/1422; H05K 7/1427
USPC .................. 361/752, 756–759, 788, 801–802
See application file for complete search history.

(56) References Cited

U.S. PATENT DOCUMENTS

| | | | | | |
|---|---|---|---|---|---|
| 6,008,995 | A * | 12/1999 | Pusateri | ............... | H05K 7/1424 |
| | | | | | 361/752 |
| 6,542,383 | B1 * | 4/2003 | Tsuyuki | ............... | H05K 9/0016 |
| | | | | | 361/728 |
| 6,661,651 | B1 * | 12/2003 | Tanzer | .................... | G06F 1/187 |
| | | | | | 361/679.33 |
| 6,741,466 | B1 * | 5/2004 | Lebo | .................... | H05K 7/1412 |
| | | | | | 361/679.01 |
| 7,042,737 | B1 * | 5/2006 | Woolsey | .............. | H05K 9/0062 |
| | | | | | 361/753 |
| 7,289,318 | B2 * | 10/2007 | Hsiao | ...................... | G06F 1/184 |
| | | | | | 361/740 |
| 7,684,208 | B2 * | 3/2010 | Okamoto | ............. | H05K 7/1487 |
| | | | | | 361/801 |
| 7,865,326 | B2 * | 1/2011 | Johnson | ................. | G01D 11/24 |
| | | | | | 710/301 |
| 7,974,093 | B2 * | 7/2011 | Zeng | .................. | H05K 7/20545 |
| | | | | | 361/704 |

(Continued)

FOREIGN PATENT DOCUMENTS

| | | |
|---|---|---|
| CN | 208922740 U | 5/2019 |
| TW | I698860 B | 7/2020 |

*Primary Examiner* — Tuan T Dinh
(74) *Attorney, Agent, or Firm* — McClure, Qualey & Rodack, LLP

(57) ABSTRACT

A tray and a server device are provided. The tray includes a tray rack, a pluggable member, and a spacer. The tray rack includes a tray rack body and an assembly convex portion. The assembly convex portion protrudes from a first end of the tray rack body, and the assembly convex portion includes a first assembly portion. The pluggable member includes a first side surface and a second side surface opposite to each other, a second assembly portion, and a third assembly portion. The second assembly portion is located on the first side surface, the second assembly portion is correspondingly assembled to the first assembly portion, and the third assembly portion is located on the first side surface. The spacer includes a third side surface and a fourth side surface opposite to each other, and a fourth assembly portion located on the third side surface.

12 Claims, 9 Drawing Sheets

100

(56) References Cited

U.S. PATENT DOCUMENTS

| 9,572,245 B1* | 2/2017 | Yu | H05K 7/20545 |
| 2017/0034927 A1* | 2/2017 | Chen | H05K 7/1489 |

* cited by examiner

130

131
135
134

133

Y
Z
X

TRAY AND SERVER DEVICE

CROSS-REFERENCE TO RELATED APPLICATION

This application claims the priority benefit of Taiwan application serial no. 112203357, filed on Apr. 12, 2023. The entirety of the above-mentioned patent application is hereby incorporated by reference herein and made a part of this specification.

TECHNICAL FIELD

The disclosure is provided is a server device, and in particular, a server device including a tray.

BACKGROUND

A common server device may use a pluggable assembly to match installation of a hard drive device. However, as a design of each server device differs from designs of other server devices, a specification of a hard drive device that the server device matches may also differ. To match hard drive devices of different specifications, it is necessary to prepare a variety of different pluggable assemblies for installation of the hard drive devices. In this case, since the pluggable assemblies cannot be shared, the versatility of the server device is limited.

SUMMARY

According to an embodiment of the invention, a tray is provided, including a tray rack, a pluggable member, and a spacer. The tray rack includes a tray rack body and an assembly convex portion. The tray rack body includes a first end and a second end opposite to the first end, the assembly convex portion protrudes from the first end, and the assembly convex portion includes a first assembly portion. The pluggable member includes a first side surface, a second side surface opposite to the first side surface, a second assembly portion, and a third assembly portion. The second assembly portion is located on the first side surface, the second assembly portion is correspondingly assembled to the first assembly portion, and the third assembly portion is located on the first side surface. The spacer includes a third side surface, a fourth side surface opposite to the third side surface, and a fourth assembly portion. The fourth assembly portion is located on the third side surface, and the fourth assembly portion is correspondingly assembled to the third assembly portion.

In some embodiments, the tray rack is adapted to be combined with a first expansion module and assembled on the tray rack body.

In some embodiments, the tray rack is adapted to be combined with an adapter and assembled on the second end of the tray rack body, and the adapter is adapted to be plugged to one end of a second expansion module.

In some embodiments, the tray rack includes a fixing portion located on the tray rack body, and the fixing portion is adapted to fix an other end of the second expansion module.

In some embodiments, the pluggable member is adapted to be combined with a third expansion module, the third expansion module is locked to the second assembly portion, and a projected area of the spacer in a long axis direction of the tray partially overlaps with the third expansion module.

In some embodiments, the pluggable member is adapted to be combined with a fourth expansion module, and the fourth expansion module is locked to the second assembly portion.

In some embodiments, the pluggable member further includes a handle portion, including a first side and a second side opposite to the first side. The first side is pivotally connected between the first side surface and the second side surface.

In some embodiments, the handle portion further includes a holding portion located on the second side and protruding to an exterior of the pluggable member.

In some embodiments, the spacer includes a locating convex portion located on the third side surface, the pluggable member includes a locating concave portion located on the first side surface, and the locating convex portion is combined with the locating concave portion.

In some embodiments, the spacer includes a plurality of heat dissipation holes, and the heat dissipation holes are arranged spaced apart on a surface between the third side surface and the fourth side surface.

Further, according to an embodiment, a server device is provided, including a housing and a tray. The tray is assembled in the housing, and includes a tray rack, a pluggable member, and a spacer. The tray rack includes a tray rack body and an assembly convex portion. The tray rack body includes a first end and a second end opposite to the first end, the assembly convex portion protrudes from the first end, and the assembly convex portion includes a first assembly portion. The pluggable member includes a first side surface, a second side surface opposite to the first side surface, a second assembly portion, and a third assembly portion. The second assembly portion is located on the first side surface, the second assembly portion is correspondingly assembled to the first assembly portion, and the third assembly portion is located on the first side surface. The spacer includes a third side surface, a fourth side surface opposite to the third side surface, and a fourth assembly portion. The fourth assembly portion is located on the third side surface, and the fourth assembly portion is correspondingly assembled to the third assembly portion.

In some embodiments, the housing includes a fastening portion, the pluggable member further includes a handle portion, including a first side and a second side opposite to the first side, the first side is pivotally connected between the first side surface and the second side surface, and the first side of the handle portion includes a hook portion to selectively snap-connect the fastening portion.

Based on the above, according to an embodiment, a tray and a server device are provided. The tray rack, the pluggable member, and the spacer that are of a combination type are assembled in correspondence to expansion modules with different specifications. The expansion module may be assembled on the tray rack, or the expansion module may be assembled on the pluggable member. In this way, the expansion modules with different specifications may be assembled in a same server device, and a design of the server device is more flexible and versatile. In addition, through arrangement of the spacer, the server device can meet design specifications or appearance requirements.

DETAILED DESCRIPTION

Figure 1:
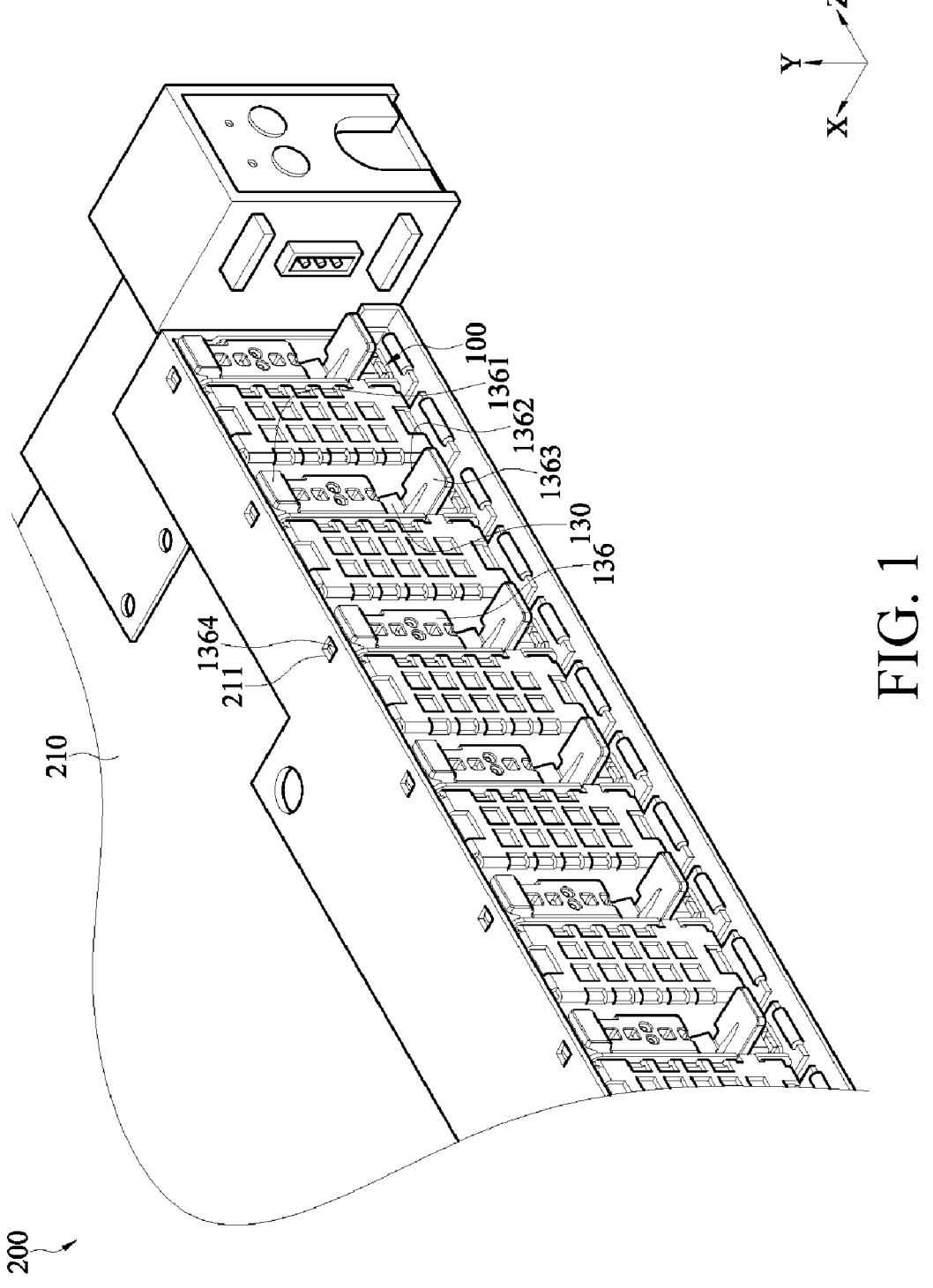
FIG. 1 is a three-dimensional diagram of a server device according to a first embodiment.
Figure 2:
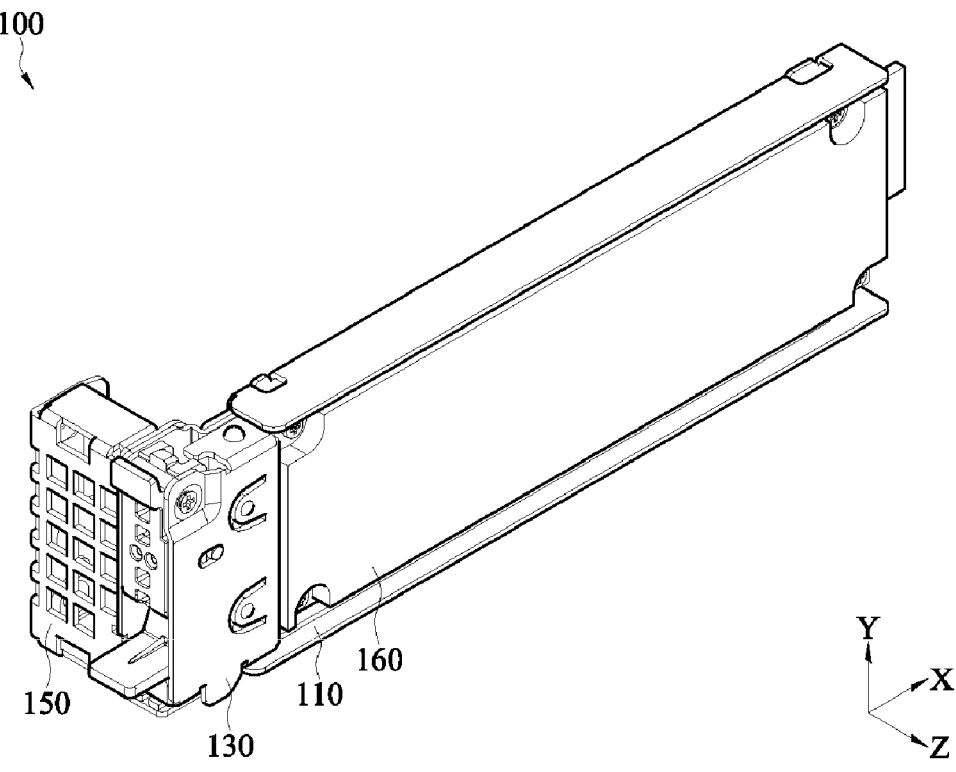
FIG. 2 is a three-dimensional diagram of a tray according to a first embodiment.
Figure 3:
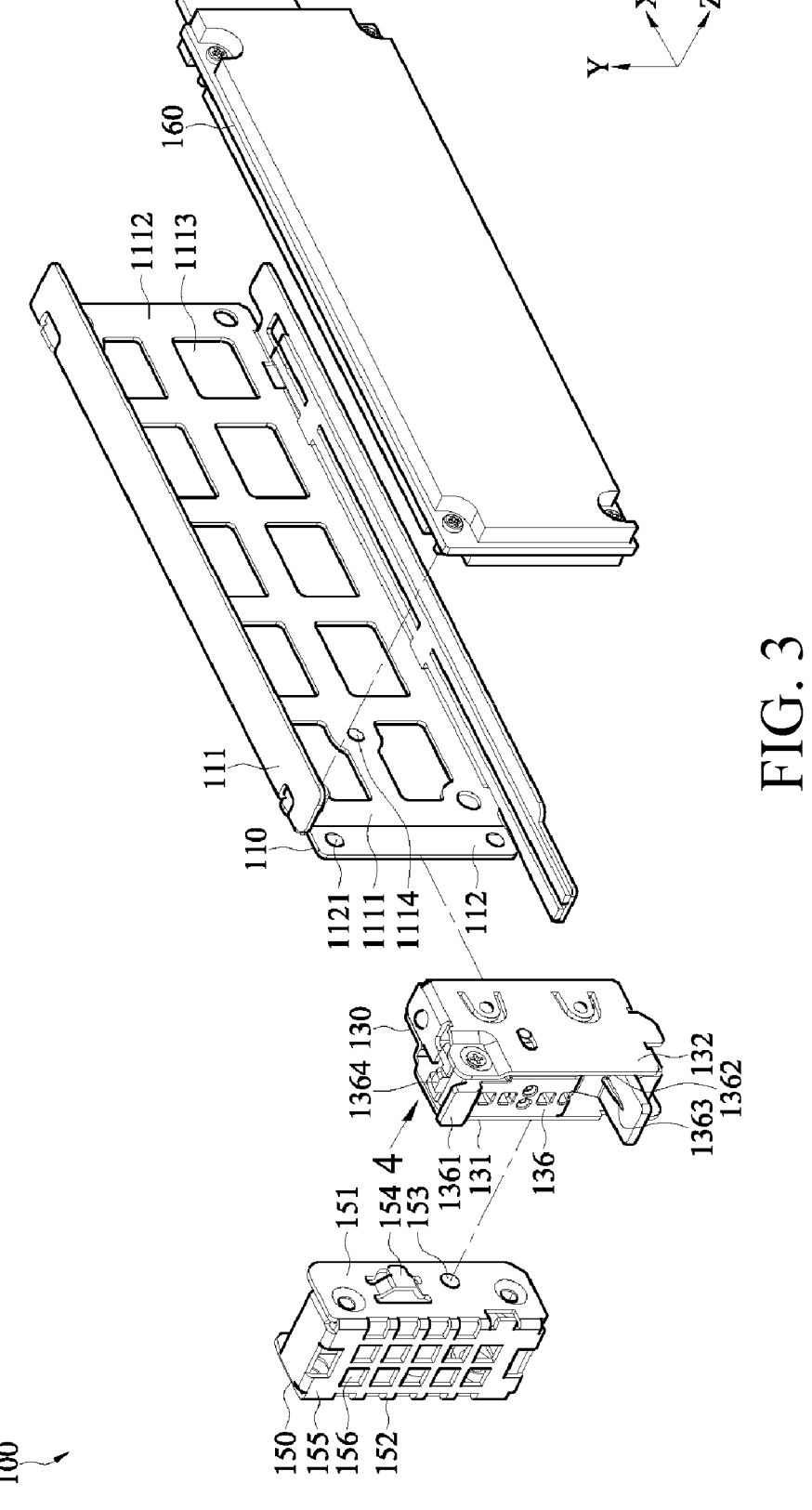
FIG. 3 is an exploded view of a tray according to a first embodiment.

Refer to FIG. 1 to FIG. 3. FIG. 1 is a three-dimensional diagram of a server device according to a first embodiment, and shows a partial appearance of the server device. FIG. 2 is a three-dimensional diagram of a tray according to a first embodiment. FIG. 3 is an exploded view of a tray according to a first embodiment. As shown in FIG. 3, in the first embodiments, a first axis X is an X axis of a three-dimensional coordinate system, a second axis Y is a Y axis of the three-dimensional coordinate system, and a third axis Z is a Z axis of the three-dimensional coordinate system. The third axis Z is arranged non-parallel to the first axis X and the second axis Y, and the first axis X and the second axis Y are substantially perpendicular to the third axis Z. A server device 200 includes a housing 210 and a tray 100. The tray 100 is assembled in the housing 210, and includes a tray rack 110, a pluggable member 130, and a spacer 150. In the first embodiment, the tray 100 is configured to carry an expansion module, and the tray 100 is inserted into the housing 210, so that the expansion module is assembled into the housing 210. The expansion module is, for example, a hard drive device, a sound card, or a network interface card. The hard drive device is used as an example herein, but the expansion module is not limited thereto.

Figure 4:
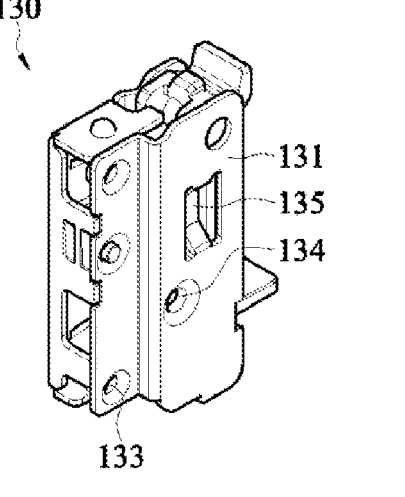
FIG. 4 is a schematic diagram of a pluggable member according to a first embodiment from another perspective.
Figure 4:
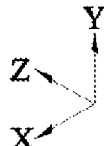

As shown in FIG. 3, the tray rack 110 includes a tray rack body 111 and an assembly convex portion 112. The tray rack body 111 includes a first end 1111 and a second end 1112 that are located on opposite sides on the first axis X. The assembly convex portion 112 protrudes from the first end 1111 along the first axis X, and the assembly convex portion 112 includes a first assembly portion 1121. As shown in FIG. 3 and FIG. 4, the pluggable member 130 includes a first side surface 131 and a second side surface 132 that are located on opposite sides on the third axis Z, a second assembly portion 133, and a third assembly portion 134. The second assembly portion 133 is located on the first side surface 131, and the second assembly portion 133 is correspondingly assembled to the first assembly portion 1121. The third assembly portion 134 is located on the first side surface 131. The spacer 150 includes a third side surface 151 and a fourth side surface 152 that are located on opposite sides on the third axis Z, and a fourth assembly portion 153. The fourth assembly portion 153 is located on the third side surface 151, and the fourth assembly portion 153 is correspondingly assembled to the third assembly portion 134, so that the pluggable member 130 and the spacer 150 are adjacently arranged along the third axis Z.

As shown in FIG. 3, in the first embodiment, the first assembly portion 1121 is two screw holes running through the assembly convex portion 112 along the third axis Z. The quantity of screw holes is only an example, and may be another number according to assembly requirements. Further, the tray rack body 111 includes a plurality of heat dissipation holes 1113, and the heat dissipation holes 1113 are arranged spaced apart.

As shown in FIG. 3 and FIG. 4, in the first embodiment, the second assembly portion 133 is two screw holes corresponding to the first assembly portion 1121, and for assembly between the first assembly portion 1121 and the second assembly portion 133, the first assembly portion 1121 and the second assembly portion 133 may be fixed to each other through screw locking. For example, the first side surface 131 of the pluggable member 130 faces the assembly convex portion 112, which enables the second assembly portion 133 to correspond to the first assembly portion 1121, and a screw member is used to fasten the screw holes of the first assembly portion 1121 and the second assembly portion 133 along the third axis Z, to complete assembly.

Referring to FIG. 3 and FIG. 4, in the first embodiment, the third assembly portion 134 of the pluggable member 130 is a screw hole, and the fourth assembly portion 153 of the spacer 150 is a screw hole corresponding to the third assembly portion 134. For example, the third side surface 151 of the spacer 150 faces the first side surface 131 of the pluggable member 130, which enables the fourth assembly portion 153 to correspond to the third assembly portion 134, and a screw member is used to fasten the screw holes of the third assembly portion 134 and the fourth assembly portion 153 along the third axis Z, to complete assembly.

As shown in FIG. 3, in the first embodiment, a first expansion module 160 is assembled on the tray rack body 111. The first expansion module 160 is a solid-state drive with a specification of 5.9 mm E1·S, and is fixed onto the tray rack body 111 through screw locking along the third axis Z. The tray 100 on which the first expansion module 160 is assembled is inserted into the housing 210 along the first axis X, to assemble and fix the first expansion module 160 to the housing 210. Although it is illustrated herein that the tray rack 110, the pluggable member 130, the spacer 150, and the first expansion module 160 are assembled to each other through screw locking, but are not limited thereto, and may alternatively be assembled through pin connection and snap connection. For the specification of the expansion module and an assembly manner of the expansion module, there may be a plurality of implementations, and other specifications and assembly manners of the expansion module are described below in detail.

As shown in FIG. 3 and FIG. 4, in the first embodiment, the spacer 150 includes a locating convex portion 154 located on the third side surface 151, and the pluggable member 130 includes a locating concave portion 135 located on the first side surface 131 and arranged corresponding to the locating convex portion 154. For example, when the spacer 150 is to be assembled to the pluggable member 130, the third side surface 151 of the spacer 150 is enabled to face the first side surface 131 of the pluggable member 130, and the locating convex portion 154 is snap-connected to the locating concave portion 135 along the third axis Z, to align the screw hole of the fourth assembly portion 153 with the screw hole of the third assembly portion 134, so that the screw holes can be directly and conveniently aligned for assembly.

As shown in FIG. 3, in the first embodiment, the spacer 150 includes a surface 155 and a plurality of heat dissipation holes 156. The surface 155 is respectively adjacent to the third side surface 151 and the fourth side surface 152, and the heat dissipation holes 156 are arranged on the surface 155 spaced apart. Therefore, when the tray 100 is assembled in the housing 210, heat dissipation efficiency of the expansion module can be improved.

Figure 5:
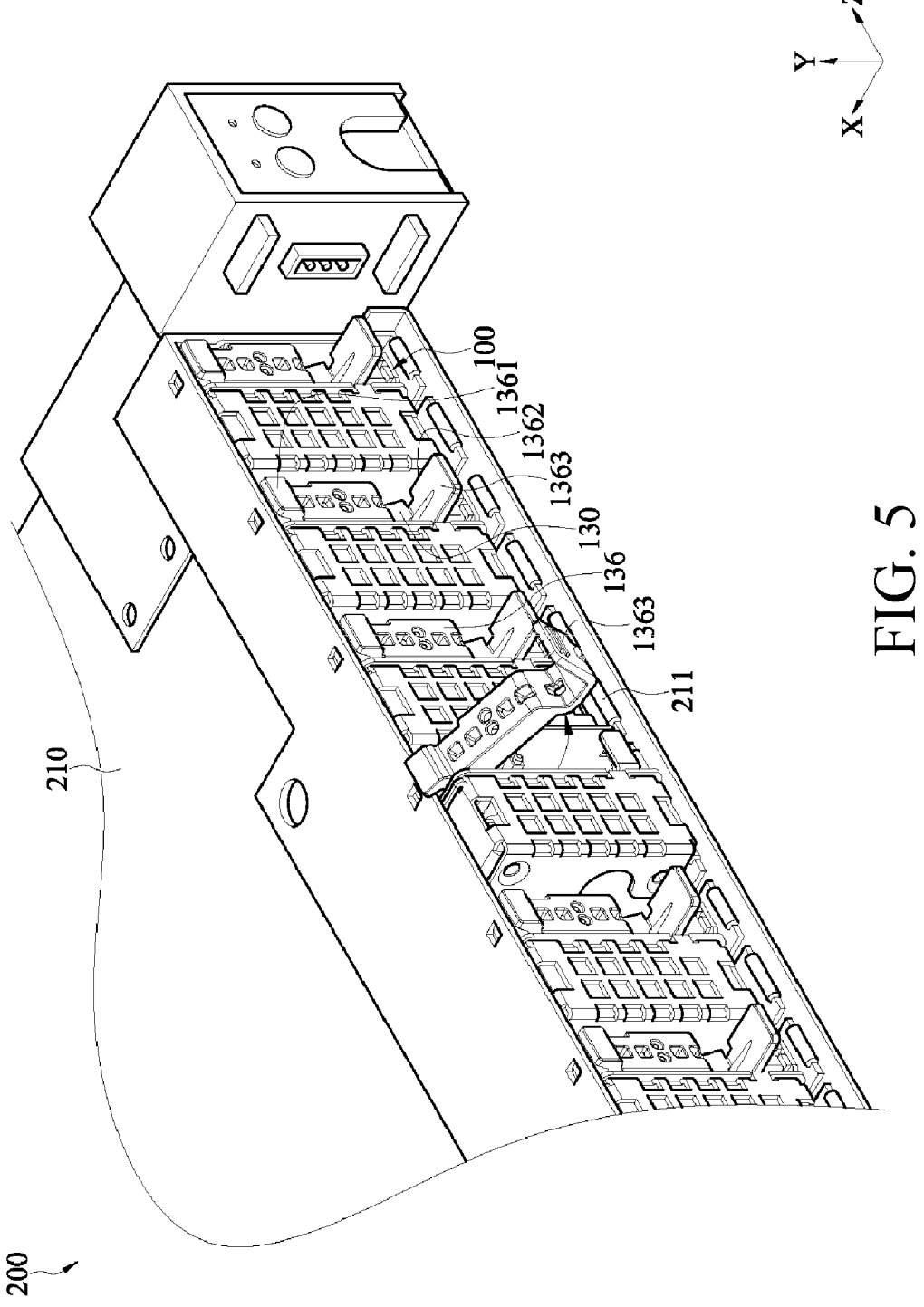
FIG. 5 is a schematic diagram of operation of a handle portion of a pluggable member according to a first embodiment.

As shown in FIG. 1 and FIG. 3, also refer to FIG. 5. FIG. 5 is a schematic diagram of operation of a handle portion of a pluggable member according to a first embodiment. In the first embodiment, the pluggable member 130 further includes a handle portion 136 including a first side 1361 and a second side 1362 that are located on opposite sides. The first side 1361 is pivotally connected between the first side surface 131 and the second side surface 132, and the second side 1362 is selectively snap-connected between the first side surface 131 and the second side surface 132. As shown in FIG. 1, the handle portion 136 is in a snap-connected state, and is substantially perpendicular to a long axis direction (that is, a direction of the first axis X). In this way, a user can hold the second side 1362, and apply a force to release the snap-connected state, as shown in FIG. 5, to enable the handle portion 136 to pivot around the third axis Z relative to the pluggable member 130. When the tray 100 is to be unplugged from the housing 210, the handle portion 136 may be pivoted by holding the second side 1362, to pull the tray 100 along the direction of the first axis X out of the housing 210. In addition, as shown in FIG. 5, the first side 1361 is abutted against the housing 210 to provide a force of keeping the tray 100 away from the housing 210, to make it easier for a user to unplug the tray 100 from the housing 210. When the tray 100 is to be inserted into the housing 210, the tray 100 is pushed into the housing 210 along the direction of the first axis X, and a user may apply a force to the handle portion 136 to ensure that the tray 100 is inserted into the housing 210, and the expansion module on the tray 100 is assembled to the housing 210.

As shown in FIG. 1 and FIG. 5, in the first embodiment, the handle portion 136 further includes a holding portion 1363 located on the second side 1362 and protruding along the long axis direction of the tray 100 to an exterior of the pluggable member 130. In this way, the user can conveniently apply a force to the handle portion to release the snap-connected state by holding a holding portion 1363 that protrudes.

Further, as shown in FIG. 1 and FIG. 3, the housing 210 includes a fastening portion 211, and the first side 1361 of the handle portion 136 includes a hook portion 1364. When the tray 100 is assembled in the housing 210, to prevent the tray 100 from falling or moving, in the snap-connected state, the hook portion 1364 of the handle portion 136 is snap-connected to the fastening portion 211, to limit movement of the tray 100. For example, even though the tray 100 is loosened, the tray 100 does not fall out of the housing 210 due to mutual snap-connection between the hook portion 1364 and the fastening portion 211.

Figure 6:
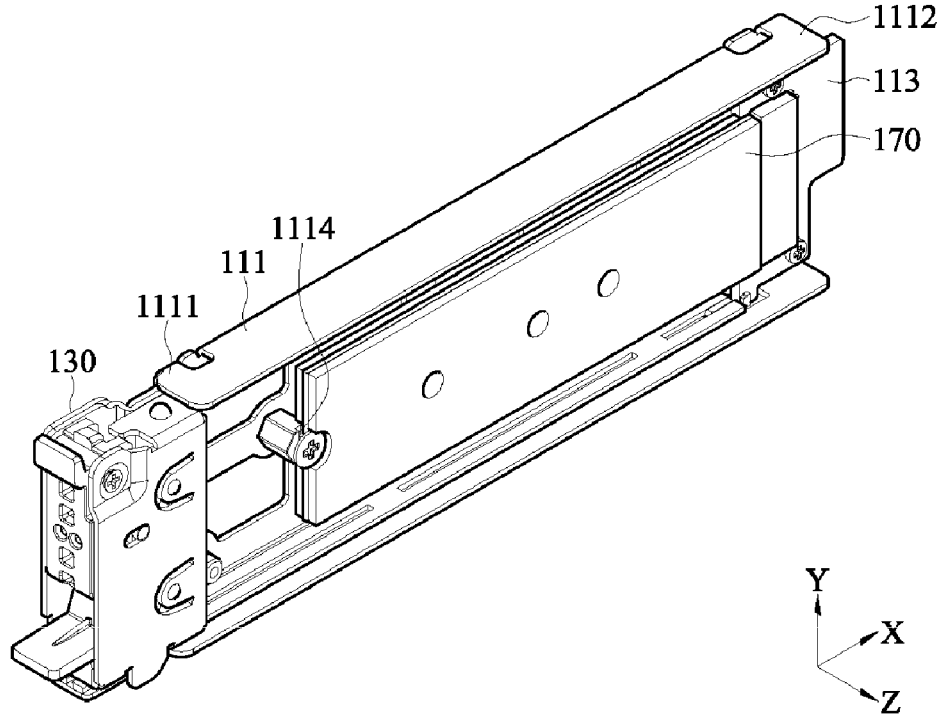
FIG. 6 is a three-dimensional diagram of a tray according to a second embodiment.
Figure 7:
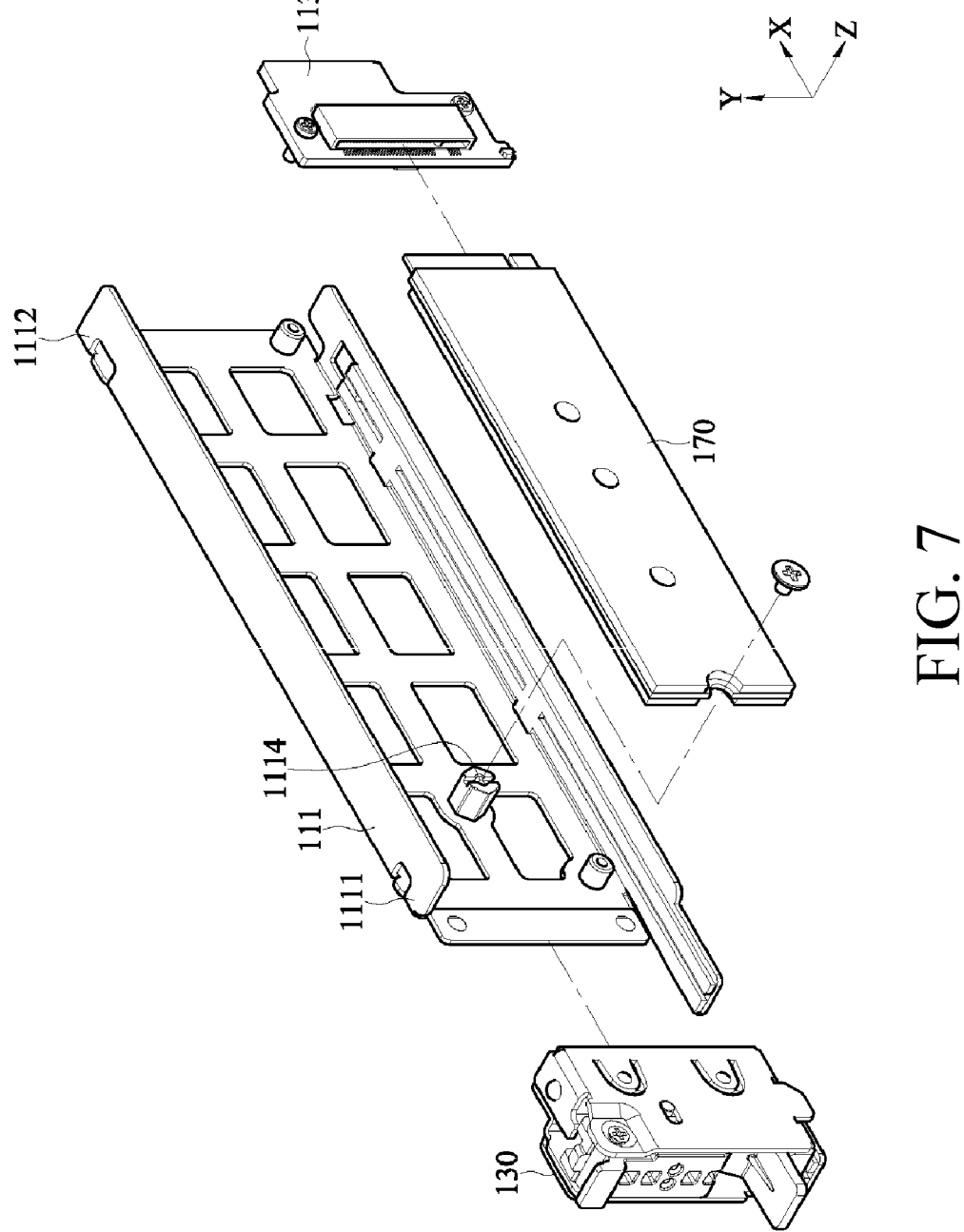
FIG. 7 is an exploded view of a tray according to a second embodiment.

For the specifications of the expansion module and the assembly manners of the expansion module, there are a plurality of implementations. In the first embodiment, the first expansion module 160 is fixed on the tray rack body 111 through screw locking, but is not limited thereto. Refer to FIG. 6 and FIG. 7. FIG. 6 is a three-dimensional diagram of a tray according to a second embodiment. FIG. 7 is an exploded view of a tray according to a second embodiment. In a second embodiment, the tray rack 110 may be combined with an adapter 113. The adapter 113 is assembled on the second end 1112 of the tray rack body 111. Because different expansion modules may have different structures of connecting portions configured for electrical connection, through the adapter 113, the different structures of the connecting portions can be integrated into a same specification. For example, a second expansion module 170 is a solid-state drive with a specification of M.2. One end of the second expansion module 170 is plugged to the adapter 113 along the first axis X, so that a structure of a connecting portion of the expansion module can be converted into another specification. Further, the tray rack 110 includes a fixing portion 1114 located on the tray rack body 111 and located between the first end 1111 and the second end 1112. As shown in FIG. 5, the fixing portion 1114 is a screw hole, and the second expansion module 170 is a solid-state drive with a small size. An other end of the second expansion module 170 relative to the end plugged to the adapter 113 may be fixed on the fixing portion 1114 along the third axis Z through screw locking.

Figure 8:
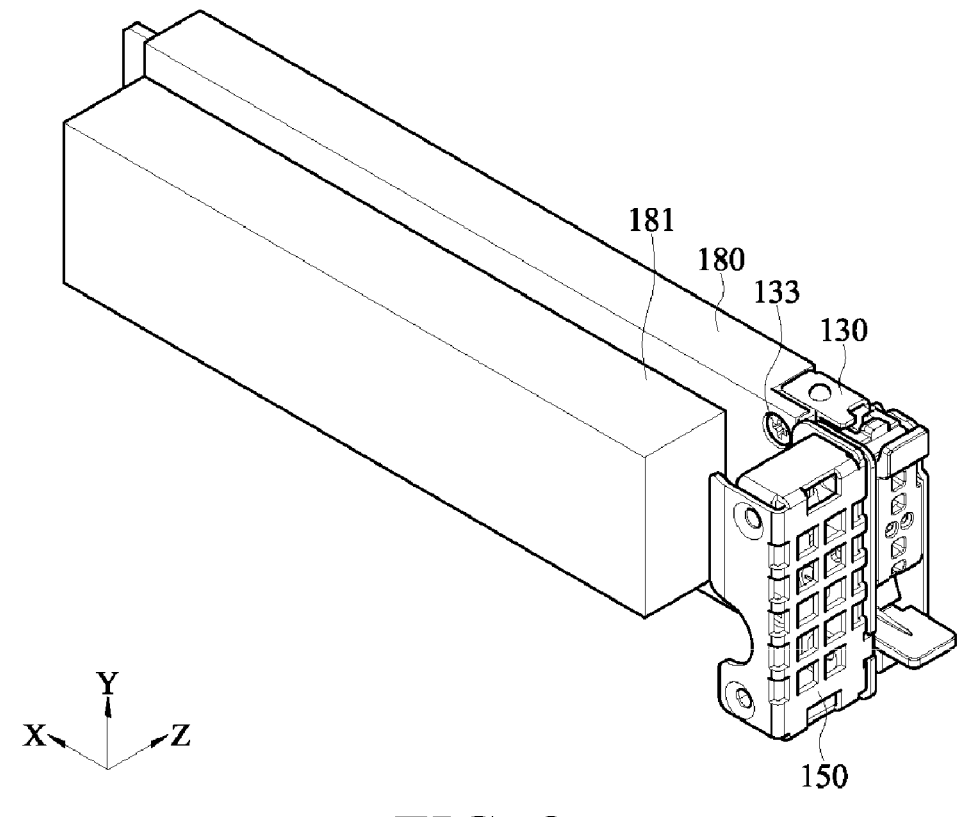
FIG. 8 is a three-dimensional diagram of a tray according to a third embodiment.

Refer to FIG. 8. FIG. 8 is a three-dimensional diagram of a tray according to a third embodiment. In a third embodiment, the pluggable member 130 may be combined with a third expansion module 180. The third expansion module 180 is a solid-state drive with a specification of 15 mm or 25 mm E1·S. For example, the third expansion module 180 may be fixed on a second assembly portion 133 of the pluggable member 130 along the third axis Z through screw locking, and the third expansion module 180 is a solid-state drive with a large thickness. As shown in FIG. 8, a projected area of the spacer 150 on the tray 100 in the long axis direction partially overlaps with the third expansion module 180. In addition, a part of the third expansion module 180 that overlaps with the projected area of the spacer 150 in the long axis direction is, for example, a heat dissipation structure 181 arranged on the third expansion module 180. Further, because the third expansion module 180 is assembled on the pluggable member 130, as shown in FIG. 8, assembly of the tray rack 110 may be omitted.

Figure 9:
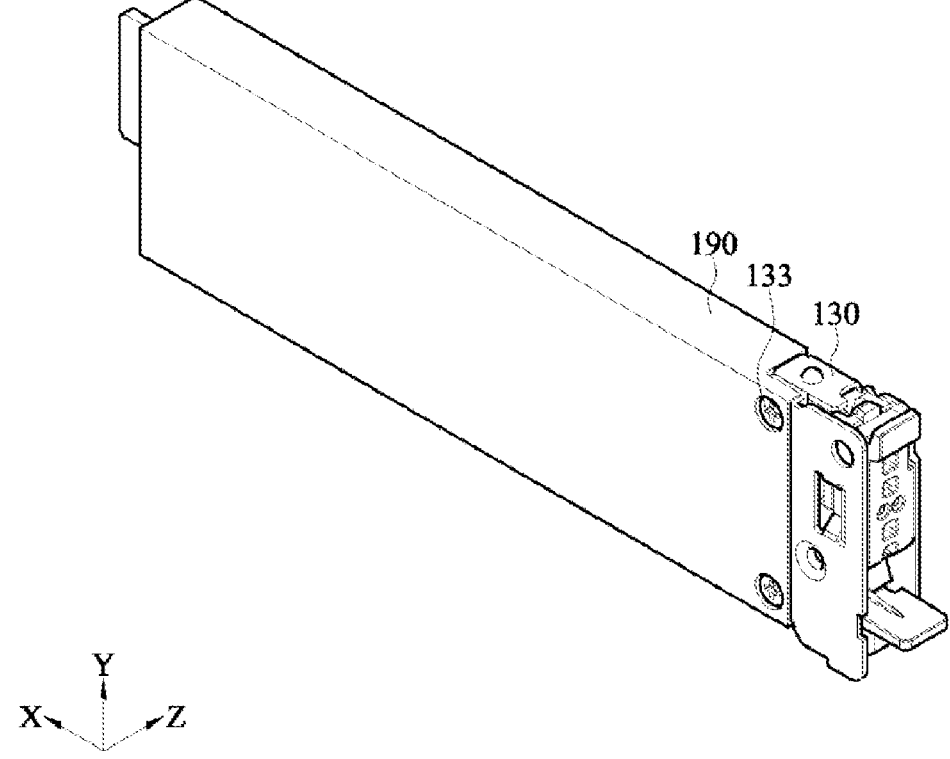
FIG. 9 is a three-dimensional diagram of a tray according to a fourth embodiment.

Refer to FIG. 9. FIG. 9 is a three-dimensional diagram of a tray according to a fourth embodiment. In a fourth embodiment, the pluggable member 130 may be combined with a fourth expansion module 190. The fourth expansion module 190 is a solid-state drive with a specification of 9.5 mm E1·S. For example, the fourth expansion module 190 may be fixed on the second assembly portion 133 along the third axis Z through screw locking. In the fourth embodiment, because the fourth expansion module 190 is assembled on the pluggable member 130, as shown in FIG. 9, assembly of the tray rack 110 may be omitted. Further, according to relevant requirements of assembly specifications and assembly design, the spacer 150 may also be omitted.

Based on the above, according to an embodiment, a tray and a server device are provided. The tray rack, the pluggable member, and the spacer that are of a combination type are assembled in correspondence to expansion modules with different specifications. The expansion module may be assembled on the tray rack, or the expansion module may be assembled on the pluggable member. In this way, the expansion modules with different specifications may be assembled in a same server device, and a design of the server device is more flexible and versatile. In addition, through arrangement of the spacer, the server device can meet design specifications or appearance requirements.

What is claimed is:
1. A tray, comprising:
a tray rack, comprising a tray rack body and an assembly convex portion, wherein the tray rack body comprises a first end and a second end opposite to the first end on a first axis, the assembly convex portion protrudes from the first end along the first axis, and the assembly convex portion comprises a first assembly portion;

a pluggable member, comprising a first side surface and a second side surface opposite to the first side surface on a third axis, a second assembly portion, and a third assembly portion, wherein the second assembly portion is located on the first side surface, the second assembly portion is correspondingly assembled to the first assembly portion, and the third assembly portion is located on the first side surface, wherein the first axis and the third axis are perpendicular to each other; and a spacer, comprising a third side surface, a fourth side surface opposite to the third side surface on the third axis, and a fourth assembly portion, wherein the fourth assembly portion is located on the third side surface, and the fourth assembly portion is correspondingly assembled to the third assembly portion, so that the pluggable member and the spacer are adjacently arranged along the third axis.

2. The tray according to claim 1, wherein the tray rack is adapted to be combined with a first expansion module and assembled on the tray rack body.

3. The tray according to claim 1, wherein the tray rack is adapted to be combined with an adapter and assembled on the second end of the tray rack body, and the adapter is adapted to be plugged to one end of a second expansion module.

4. The tray according to claim 3, wherein the tray rack comprises a fixing portion located on the tray rack body, and the fixing portion is adapted to fix an other end of the second expansion module.

5. The tray according to claim 1, wherein the pluggable member is adapted to be combined with a third expansion module, the third expansion module is locked to the second assembly portion, and a projected area of the spacer in a long axis direction of the tray partially overlaps with the third expansion module.

6. The tray according to claim 1, wherein the pluggable member is adapted to be combined with a fourth expansion module, and the fourth expansion module is locked to the second assembly portion.

7. The tray according to claim 1, wherein the pluggable member further comprises a handle portion, comprising a first side and a second side opposite to the first side, wherein the first side is pivotally connected between the first side surface and the second side surface.

8. The tray according to claim 7, wherein the handle portion further comprises a holding portion located on the second side and protruding to an exterior of the pluggable member.

9. The tray according to claim 1, wherein the spacer comprises a locating convex portion located on the third side surface, the pluggable member comprises a locating concave portion located on the first side surface, and the locating convex portion is combined with the locating concave portion.

10. The tray according to claim 1, wherein the spacer comprises a plurality of heat dissipation holes, and the heat dissipation holes are arranged spaced apart on a surface between the third side surface and the fourth side surface.

11. A server device, comprising:

a housing; and a tray, assembled in the housing and comprising:

a tray rack, comprising a tray rack body and an assembly convex portion, wherein the tray rack body comprises a first end and a second end opposite to the first end on a first axis, the assembly convex portion protrudes from the first end along the first axis, and the assembly convex portion comprises a first assembly portion;

a pluggable member, comprising a first side surface and a second side surface opposite to the first side surface on a third axis, a second assembly portion, and a third assembly portion, wherein the second assembly portion is located on the first side surface, the second assembly portion is correspondingly assembled to the first assembly portion, and the third assembly portion is located on the first side surface, wherein the first axis and the third axis are perpendicular to each other; and a spacer, comprising a third side surface, a fourth side surface opposite to the third side surface on the third axis, and a fourth assembly portion, wherein the fourth assembly portion is located on the third side surface, and the fourth assembly portion is correspondingly assembled to the third assembly portion, so that the pluggable member and the spacer are adjacently arranged along the third axis.

12. The server device according to claim 11, wherein the housing comprises a fastening portion, the pluggable member further comprises a handle portion, comprising a first side and a second side opposite to the first side, the first side is pivotally connected between the first side surface and the second side surface, and the first side of the handle portion comprises a hook portion to selectively snap-connect the fastening portion.

\* \* \* \* \*